US 6,693,465 B1

(12) United States Patent
Rosno et al.

(10) Patent No.: US 6,693,465 B1
(45) Date of Patent: Feb. 17, 2004

(54) OPEN INPUT SENSE FOR DIFFERENTIAL RECEIVER

(75) Inventors: Patrick Lee Rosno, Rochester, MN (US); James David Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/345,558

(22) Filed: Jan. 16, 2003

(51) Int. Cl.[7] ................................................ H03K 5/22
(52) U.S. Cl. ............................................ 327/71; 327/75
(58) Field of Search .............................. 327/63, 65–67, 327/71, 74, 75, 89, 563

(56) References Cited

U.S. PATENT DOCUMENTS 6,288,577 B1    9/2001  Wong 6,603,355 B2 *  8/2003  Delano ....................... 330/258

* cited by examiner

Primary Examiner—Kenneth B. Wells
(74) Attorney, Agent, or Firm—Robert R. Williams

(57) ABSTRACT

Circuitry is disclosed for detection of open inputs on an enhanced differential receiver. A pulldown terminator is coupled to the inputs of the enhanced differential receiver. If the differential inputs are not actively driven, the voltage on both differential inputs will be pulled to a predetermined voltage. When the voltage on the differential inputs reach a reference voltage, an active device detects that the reference voltage has been reached, and produces a predetermined logic value on an output of the enhanced differential receiver. The enhanced differential receiver is not subject to oscillation when not actively driven. Delay through the enhanced differential receiver is not substantially greater than delay through a conventional differential receiver consisting of only a differential amplifier.

22 Claims, 7 Drawing Sheets

OPEN INPUT SENSE FOR DIFFERENTIAL RECEIVER

FIELD OF THE INVENTION

The present invention relates to differential receivers. More particularly, the present invention relates to sensing when inputs to the differential receiver are not connected to a driving source.

DESCRIPTION OF RELATED ART

Current electronic systems, such as computer processors, data switches, data storage systems, and the like, must send data back and forth from processor to processor, from data storage systems to processor, or in general, from any electronic unit to another electronic unit that must communicate. For example, a processor may require data that resides on a data storage system such as a hard disk. To get the data, the processor typically sends a request for the data over signal interconnections to the storage system. The request typically contains addressing data and perhaps an amount of data to be retrieved. The storage system receives and interprets the request, retrieves the data from its storage medium (e.g., hard disk), and transmits the data back to the processor.

Performance of the electronic system is highly dependent upon the rate of data transmission between one unit and another unit. In the example of the computer system wherein the processor requires data resident in the storage system, in many cases, the processor is idle until the processor receives the data. Many modern computer processors have more than one task assigned to a processor. In such cases, the processor can usually begin or reawaken other tasks while awaiting data from the storage system for the task requiring data from the storage system. Nonetheless, high-speed data transmission is very important in maximizing throughput in the computer system.

Data is typically routed on electrically conducting signal wires in one of two techniques. A first technique, known as single-ended signaling, uses a single wire for a single signal and references the signal to a voltage supply. Return currents typically flow through a voltage supply plane on a printed wiring board (PWB) or through supply conductors in cabling through which the signal wire is passed. The return currents may be passed through capacitors of suitable capacitance values and suitably low resistive and inductive parasitics from one voltage supply to another, if a single voltage supply cannot be continuously routed near the signal wire.

A receiver of a single-ended signal must compare the voltage of the signal against a voltage referenced to one or more supplies at the receiver. For example, if the signal switches from a first voltage (e.g., ground) to a second voltage (e.g., Vdd), the receiver may interpret a signal voltage exceeding (Vdd-ground)/2 as a logical "1", and a signal voltage less than (Vdd-ground)/2 as a logical "0". Unfortunately, the local supply voltages at the receiver may not be exactly the same as the supply voltages at the driver of the single-ended signal. Supply voltages may in fact be (and usually are, for electronic units physically separated by significant distance) voltage supplies created by different power supplies. Furthermore, local supply "bounce" voltage aberrations are caused by switching of large numbers of other signals on a semiconductor chip upon which the driver resides or upon which the receiver resides. All these factors result in significant uncertainty in determining exactly when a single-ended signal is actually interpreted as a "1" or a "0".

A second signaling technique is called differential signaling. The second technique is typically used in very high-speed signaling, especially when significant distances are involved, and uses two electrical conductors per signal. A first phase of the data, referred to as a positive phase, is sent on a first conductor. A second phase of the data, referred to as a negative phase, is sent on a second conductor. The two phases carry the same data, but are complementary. For example, consider a design wherein an uplevel is 2 volts and a downlevel is 1 volt. A logical "1" is on the differential signal when the positive phase is at 2 volts and the negative phase is at 1 volt. When a logical "0" is on the differential signal, the positive phase is at 1 volt and the negative phase is at 2 volts. A driver of the differential signal is advantageously designed to cause transitions of the positive phase and the negative phase to occur at substantially the same time and at substantially the same speed (i.e., dV/dt) on the two conductors.

A differential receiver receiving a differential signal does not have to interpret either phase of the differential signal versus a voltage supply at the receiver. Rather, the differential receiver merely needs to determine whether the positive phase or the negative phase is of higher voltage. Differential receivers typically comprise a differential amplifier having suitable "common mode" range to determine whether the differential signal is "1" or "0".

"Common Mode" range denotes the voltage range of the inputs through which the differential amplifier operates properly. For example, suppose that a differential driver drives a 1-volt to 2-volt differential signal. Further suppose that there is a –0.5 volt "ground shift" between the driver and the receiver, which is to be expected, especially if the driver and the receiver are many meters apart. The receiver would see the signals at 1.5 volts to 2.5 volts due to the shift. The differential receiver, as explained above, simply compares the positive phase voltage to the negative phase voltage. The differential amplifier in the example, however, has to be able to perform the comparison when both signals are 0.5 volt higher than would nominally be expected.

Differential signals are frequently used to transmit data over significant distances, and pluggable cables are often used for the signaling conductors. Pluggable cables create a problem, in that a particular cable may not be plugged in properly. Furthermore, in a particular electronic system, a particular differential receiver may be deliberately left unconnected to any driven differential signal. For example, a particular electronic system may have an electronic unit capable of receiving 16 differential signals in a fully configured system, but sold with only 8 differential signals actually used in a subset configuration, with the other 8 receivers not coupled to driven differential signals. Differential receivers not coupled to driven differential signals should output a predictable logical value, e.g., a "1" or a "0". Care must be taken to ensure that a differential receiver that is not coupled to a driven differential signal does not oscillate, which could occur if both of the undriven inputs were at substantially the same voltage. Both of the disconnected inputs of a differential receiver are typically coupled together by a terminator, and would therefore be at substantially the same voltage.

A number of techniques exist to ensure that a differential receiver outputs a known logical value when the differential receiver inputs are not coupled to a differential signal. For example, FIG. 1 shows differential receiver 100, having a differential receiver input port comprising inputs INP 107 and INN 108, and comprising differential amplifier 105 coupled to INP 107 and INN 108. A terminator comprising R101 and R102 is shown. Such a terminator is commonly placed between the inputs of a differential receiver to electrically terminate a differential signaling pair of conductors, often referred to as a transmission line. A high-valued pulldown resistor R103 is coupled to the midpoint connection between R101 and R102. The other end of R103 is coupled to a voltage supply −V 109. Pulldown resistor R103 pulls both INP 107 and INN 108 to the voltage of −V 109 when INP 107 and INN 108 are disconnected from a driven differential signal. −V 109, in the example, is less than $V_{REF}$ 110. Comparator 104 detects that a first comparator input, coupled to the midpoint connection between R102 and R103 is below $V_{REF}$ 110 and outputs a logical "0". AND 106 receives an output from differential amplifier 105 and also receives an output from comparator 104. When the output from comparator 104 is at a logical "0", AND 106 drives Out 111 to a logical "0", regardless of the logical value outputted from differential amplifier 105. The circuitry shown in FIG. 1 does output a known logical value when the differential receiver is not connected to a driven differential signal. However, comparator 104 and AND 106 are required. Furthermore, since INP 107 and INN 108 are at substantially the same voltage, differential amplifier 105 may still oscillate, consuming power and driving noise into a power supply grid. AND 106 adds delay to a functional data path from the differential input comprising INP 107 and INN 108 to Out 111.

A second technique practiced in differential receiver art is the circuit shown in FIG. 2. Differential receiver 200 comprises differential amplifier 205 having a first input coupled to INP 207 and a second input coupled to INN 208. Terminating resistor R202 provides the same impedance termination function of the series combination of R101 and R102 in differential receiver 100. In addition, a high-valued resistor R201 is coupled to a voltage supply −V 209 as well as to the first input of differential amplifier 205. A second high-valued resistor R203 is coupled to a second input of differential amplifier 205 and to voltage supply +V 208. When INP 207 and INN 208 are not coupled to a driven differential signal, the circuit of FIG. 2 inserts an offset voltage that ensures that INP 207 and INN 208 are at slightly different voltages, thereby ensuring a known logic level driven on Out 211, and further ensuring that differential amplifier 205 does not oscillate. A drawback of this technique is that the small offset, typically 30–35 mV, degrades the signal margin when a driven differential signal is coupled to the inputs of the differential receiver.

U.S. Pat. No. 6,288,577, by Anthony Wong, teaches a technique similar to the technique shown in FIG. 1. Both inputs of a differential amplifier have high-resistance pullup resistors. Each input to the differential amplifier are further coupled to an input of a comparator; a second input of each comparator is coupled to a reference voltage. An output of each comparator is logically combined with an output of the differential receiver, ensuring a known output logic value if either input, or both inputs, of the differential signal is not coupled to a driving signal. Two extra stages of delay (intrinsic delays of NOR 48 and inverter 52) are shown in the functional path described. Obviously, this could be reduced to only the intrinsic delay of NOR 48, depending on choice of phase.

Therefore, a need exists for an enhanced differential receiver that will output a predetermined logic value and will not oscillate when inputs of the differential receiver are not coupled to a driven differential signal, and when coupled to a driven differential signal, does not degrade signal margin, and incurs substantially no delay beyond the delay of an unenhanced differential receiver in which the delay path consists only of a differential amplifier.

SUMMARY OF THE INVENTION

The present invention discloses an enhanced differential receiver that provides a predetermined logical output when the differential receiver input port is not actively driven. The enhanced differential driver has the further advantage of suppressing oscillation when the differential receiver input port is not actively driven. Yet a further advantage is that the enhanced differential receiver has substantially no delay penalty versus a convention differential receiver in which the delay path consists of only a differential amplifier.

In an embodiment, the enhanced differential receiver comprises a differential amplifier further comprising a first active device, having a control port coupled to a first input of the differential receiver, and a second active device having a control port coupled to a second input of the differential receiver. The differential amplifier further comprises a third active device, integrated within the differential amplifier, coupled in parallel with the first device, but having a control port coupled to a reference voltage. In a further embodiment, a fourth active device is coupled in parallel with the second active device, but having a control port coupled to a voltage ensuring that the fourth active device never conducts.

In an exemplary embodiment, all active devices in the differential amplifier are implemented with NPN transistors. In another exemplary embodiment, all active devices in the differential amplifier are implemented with PNP transistors. In yet another exemplary embodiment, all active devices in the differential amplifier are implemented with N-channel Field Effect Transistors (NFETs). In still another exemplary embodiment, all active devices in the differential amplifier are implemented with P-channel Field Effect Transistors (PFETs).

DETAILED DESCRIPTION OF THE PREFERRED EMBODIMENTS

Having reference now to the figures, the invention will now be described in detail. The present invention discloses an enhanced differential receiver that outputs a predetermined logical value when neither a first input nor a second input of a differential receiver input port is actively driven. This condition often occurs when a differential signaling cable is accidentally unplugged, or when only a partial configuration of an electronic system is implemented, with some differential receivers deliberately not connected to active differential drivers. The present invention incurs substantially no delay penalty over a conventional differential receiver in which the delay path consists only of a differential amplifier.

Figure 1:
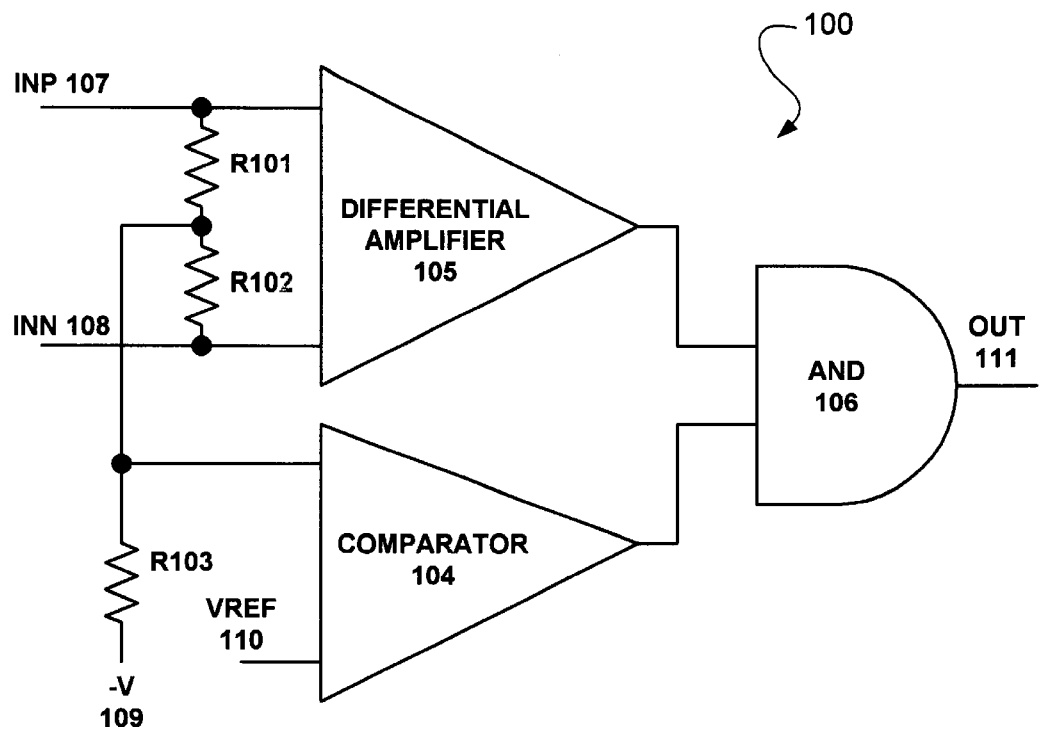
FIG. 1 shows a block diagram of a conventional differential receiver.
Figure 2:
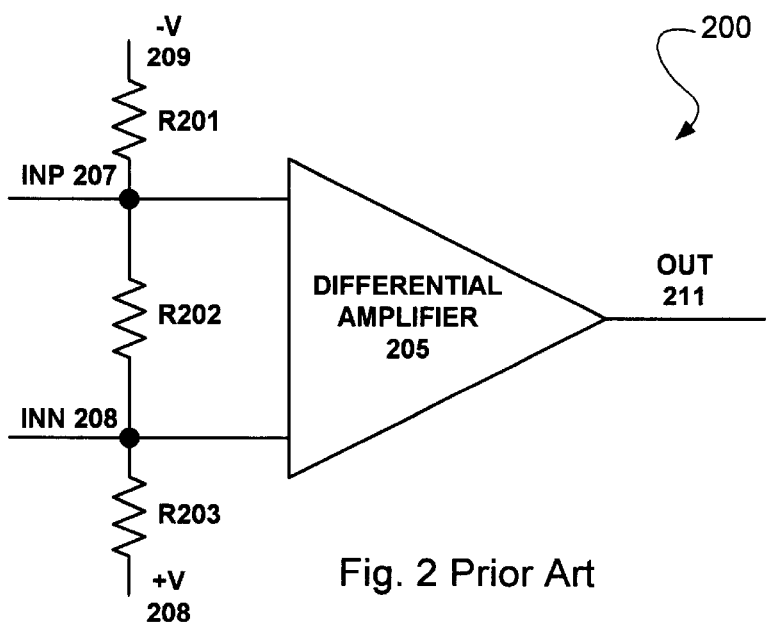
FIG. 2 shows a block diagram of a second conventional differential receiver.

FIGS. 1 and 2 show two examples of previous attempts directed at solving problems encountered when the inputs are not actively driven. Discussion of these attempts was given above.

Figure 3A:
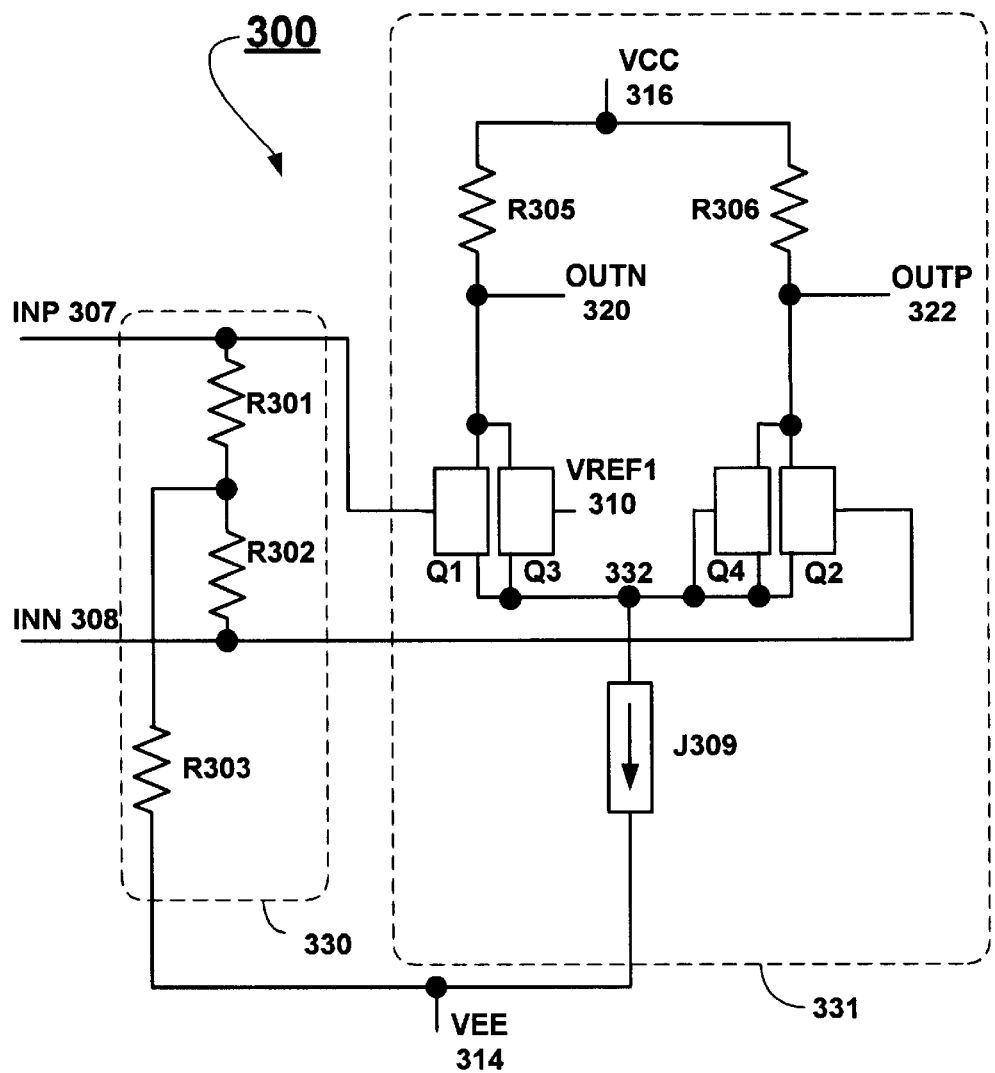
FIG. 3A shows a schematic of an enhanced differential receiver.

FIG. 3A shows an enhanced differential receiver 300, comprising a differential amplifier 331, a pulldown terminator 330, a differential receiver input port comprising a first input INP 307, and a second input INN 308, and a differential receiver output port. The differential receiver output port comprises outputs OUTP 322 and OUTN 320, as shown, although alternative embodiments of the output port are discussed below. OUTP 322, in an embodiment, is a sole output of enhanced differential receiver 300. In an embodiment, OUTN 320 is a sole output of enhanced differential receiver 300. In an embodiment, OUTP 322 and OUTN 320 are further amplified to produce a sole output of enhanced differential receiver 300. In yet another exemplary embodiment, OUTP 322 and OUTN 320 together are the output of enhanced differential receiver 300. These embodiments of the output port of enhanced differential receiver 300 further apply to enhanced differential receivers 300A, 300B, 300C, and 300D, shown in FIGS. 3B, 3C, 3D, and 3E, respectively.

Enhanced differential receiver 300 is advantageously constructed on a semiconductor chip. A single enhanced differential receiver 300 or a number of instances of enhanced differential receiver 300 may be placed upon a single semiconductor chip. Enhanced differential receivers 300A, 300B, 300C, and 300D are further embodiments of the invention, and each is constructed on a semiconductor chip as a single instance or in multiple instances.

Pulldown terminator 330 is designed to terminate a differential signal being received from a transmission line by enhanced differential receiver 300. Signal conductors for high-speed signals are referred to as transmission lines in the relevant literature. Typically, in modern computer systems, differential signals require 100 ohms between the signal conductors of a transmission line at the receiver to properly terminate the transmission line, thereby preventing unwanted reflections from incoming signals from propagating backwards on the transmission line. Other termination resistance values are contemplated, and depend upon the particular transmission line impedance of the transmission line over which the differential signal is transmitted. Pulldown terminator 330 comprises Resistors R301, R302, and R303 in the exemplary differential receiver 300. Resistors R301 and R302 are advantageously of equal value, both resistors being 50 ohms, in the case where 100 ohms is needed to properly terminate the transmission line.

Pulldown terminator 330 also comprises a bias mechanism that provides a pull (i.e., a voltage pull) on inputs INP 307 and INN 308 towards a predetermined voltage. R303, coupled to the node where R301 and R302 are connected, and further coupled to a suitable voltage supply such as $V_{EE}$ 314, is an exemplary embodiment of the bias mechanism. R303 is shown as a resistor, and R303 is advantageously of high resistance value relative to R301 and R302 in order that accurate termination is accomplished by R301 and R302 without needing to consider R303 as a significant contributor to the termination resistance.

The pull on INP 307 and INN 308 detracts from the common mode range of the design, and the actual maximum strength of the pull depends on the common mode range required in a particular design. A discussion of common mode range requirements was given above.

Note that although pulldown terminator 330 is designed to pull INP 307 and INN 308 to a relatively low voltage in some embodiments, as will be explained shortly, in some embodiments, pulldown terminator 330 is designed to pull INP 307 and INN 308 to a relatively higher voltage, as will also be explained shortly. The term "pulldown terminator" is intended to simply denote that the terminator will cause the voltage on INP 307 and INN 308 to move to a predetermined voltage when INP 307 and INN 308 are not actively driven. No offset voltage between INP 307 and INN 308 is incurred as long as R301 and R302 are of equal resistance.

It should be noted that in the exemplary enhanced differential receiver 300 circuit of FIG. 3A, that resistor R303 in pulldown terminator 330 is used to pull INP 307 and INN 308 to a predetermined voltage when INP 307 and INN 308 are not actively driven. The invention contemplates any means to pull INP 307 and INN 308, including a low-current current source alternative to R303 (not shown), or a high-valued resistor (not shown) between INP 307 and a first voltage supply (e.g., $V_{EE}$ 314) and a second high-valued resistor (not shown) between INN 308 and a second voltage supply of the same voltage as the first voltage supply, advantageously being the same voltage supply (e.g., $V_{EE}$ 314).

Differential amplifier 331 is a differential amplifier having three inputs. A first differential input is coupled to the first input, INP 307, of differential receiver 300. Differential amplifier 331 has a second differential input that is coupled to the second input, INN 308, of differential receiver 300. Differential amplifier 331 has a reference input coupled to a reference voltage $V_{REF1}$, 310. Differential amplifier 331 has outputs coupled directly to differential receiver 300 outputs OUTN 320 and OUTP 322.

Differential amplifier 331, in the exemplary enhanced differential receiver 300, is shown to comprise a first active device Q1 having a first control port coupled to the first input, INP 307. The first active device Q1 also has a collector/drain port coupled to OUTN 320, and an emitter/source port coupled to node 332. Differential amplifier 331 has a second active device Q2 having a second control port coupled to the second input, INN 308. The second active device Q2 has a collector/drain port coupled to OUTP 322, and an emitter/source port coupled to node 332. Collector/drain ports of Q1 and Q2 are coupled to loads R305 and R306, respectively. In a preferred embodiment, loads R305 and R306 are resistors, as shown in FIG. 3A. Other embodiments (not shown) of loads R305 and R306 are well known in differential amplifier art, and include current sources, as well as embodiments utilizing resistors with emitter follower clamps. A current J309 passes through Q1 or Q2, during normal operation as a differential receiver, with a driven differential signal entering on INP 307 and INN 308. When a voltage difference between INP 307 and INN 308 turns on Q1 and turns off Q2, substantially all current J309 passes through Q1. When a voltage difference between INP 307 and INN 308 turns on Q2 and turns off Q1, substantially all current J309 passes through Q2. As current is passed through Q1 or Q2, a voltage drop occurs across load R305 or R306, respectively, thereby producing an output signal on OUTN 320 and OUTP 322. In an embodiment, OUTN 320 and OUTP 322 are coupled to an amplifier circuit where the signal of OUTN 320 and OLTP 322 are further amplified and converted into the native logic levels on a chip on which the differential receiver is fabricated. In such an embodiment, the output port from which the signal(s) are output can comprise one or both logical phases (i.e., true and/or complement). Such further amplification and conversion is well known, and is not shown. In an embodiment, OUTN 320 and OUTP 322 are the output port without further amplification and conversion as a differential output of enhanced differential receiver 300. In one embodiment, OUTN 320 is the sole output of enhanced differential receiver 300. In yet another embodiment OUTP 322 is the sole output of enhanced differential receiver 300.

When INP 307 and INN 308 are not actively driven, pulldown terminator 330 in enhanced differential receiver 300 pulls both INP 307 and INN 308 towards $V_{EE}$. As the voltage on INP 307 and INN 308 moves past $V_{REF1}$ 310, Q3 turns on and substantially all current J309 flows through Q3, and both active devices Q1 and Q2 are off. As long Q1 and Q2 are off, Q3 carries current J309, producing a voltage drop across load R305. Q3, therefore, ensures that the output of enhanced differential receiver 300 is at a predetermined logical state when both inputs to enhanced differential receiver 300 (i.e., INP 307 and INN 308) have been pulled beyond a predetermined voltage, $V_{REF1}$, 310, in the example. Since both active devices Q1 and Q2 are off when both inputs INP 307 and INN 308 are beyond $V_{REF1}$ 310, so as to turn on Q3, no oscillation in enhanced differential receiver 300 can occur, as might happen if the control input of Q1 and the control input of Q2 are at substantially the same voltage with Q3 not present.

In an alternative embodiment, Q3 is coupled in parallel with Q2, instead of being coupled in parallel with Q1, which simply inverts the phase of the outputs OUTN 320 and OUTP 322 when the inputs of enhanced differential receiver 300 are not actively driven.

Active device Q4 is added as shown in enhanced differential receiver 300, in an embodiment, to make loading on differential amplifier 331 symmetrical. Q4 has a collector/drain port coupled to the collector/drain port of Q2, and has an emitter/source port coupled to the emitter/source port of Q2. Q4 is designed to possess the same characteristics as Q3, so that the parasitic collector/drain capacitance of Q3 on OUTN 320 is balanced by the parasitic collector/drain capacitance of Q4 on OUTP 322. Q4 has a control input coupled to a disabling voltage suitable to ensure that Q4 never conducts.

Figure 4A:
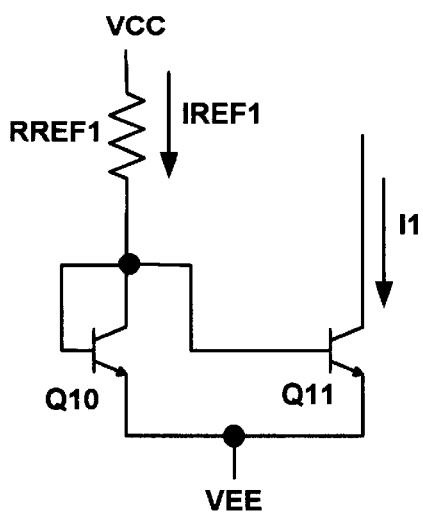
FIGS. 4A–4C show several exemplary current source circuits.
Figure 4B:
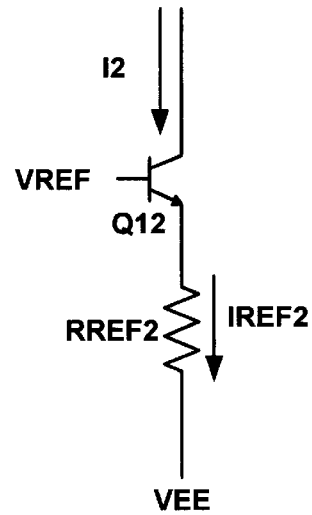
Figure 4C:
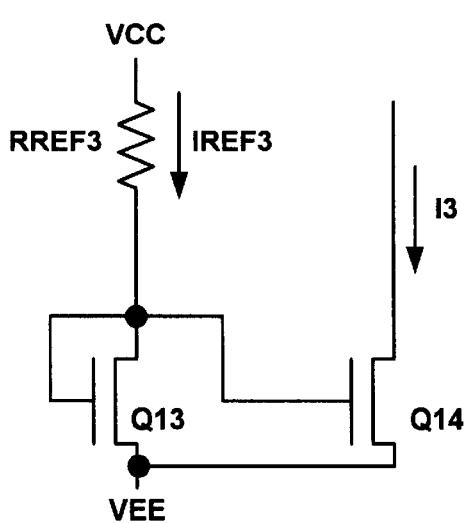

Current J309 is switched by Q1 and Q2 when enhanced differential receiver 300 is receiving a driven differential signal on INP 307 and INN 308. Current J309 is carried by Q3 when enhanced differential receiver 300 is not receiving a driven differential signal, as described above. Advantageously, current J309 is a current source. Many implementations of current sources are known in the art. FIGS. 4A–4C show exemplary current sources suitable for use as embodiments of current J309, depending on the process and semiconductor technology used to implement active devices Q1–Q4. In an embodiment, a simple resistor, coupled between node 332 and a suitable voltage supply, supplies current J309.

Figure 3B:
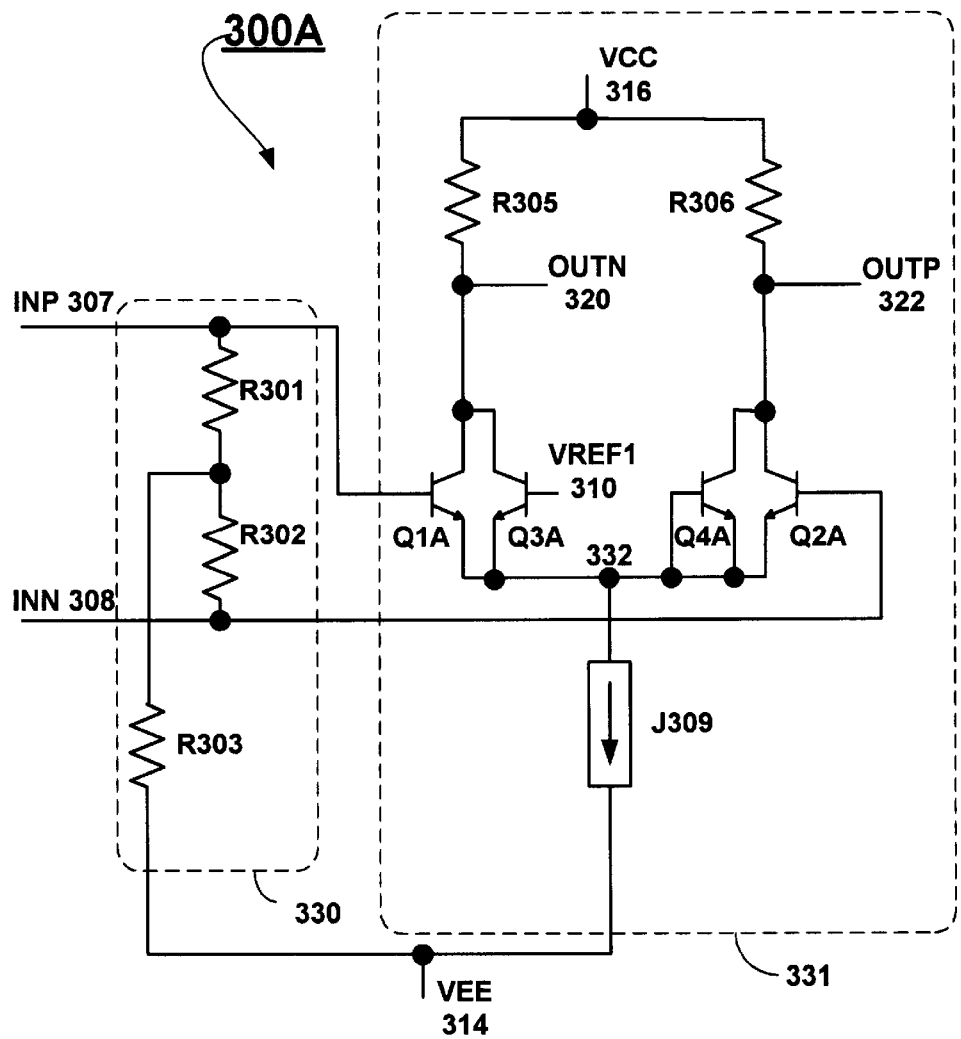
FIG. 3B shows a schematic of an enhanced differential receiver comprising NPN transistors.

Enhanced differential receiver 300A, shown in FIG. 3B, is an embodiment of enhanced differential receiver 300, in which the active devices Q1–Q4 are NPN transistors Q1A–Q4A. Remaining components with identical functions as in enhanced differential receiver 300 retain the same reference IDs. $V_{EE}$ 314 is negative with respect to $V_{CC}$ 316 in enhanced differential receiver 300A. When a differential driver actively drives INP 307 and INN 308, Q1A carries the current from current J309 if INP 307 is of higher voltage than INN 308. If INN 308 is of higher voltage than INP 307, then Q2A carries current J309. Q3A carries current J309 when INP 307 and INN 308 are not driven and are pulled by pulldown terminator 330 to a voltage less than $V_{REF1}$; OUTN 320 will be negative with respect to OUTP 322 in this condition. The current sources shown in FIG. 4A and FIG. 4B are exemplary current sources used in embodiments of current J309. In an embodiment, a simple resistor coupled between node 332 and a suitable voltage supply supplies current J309. In an embodiment, Q4A is omitted. In a preferred embodiment, Q4A is added to ensure symmetrical loading at OUTN 320 and OUTP 322. A base of Q4A is coupled to a disabling voltage source low enough with respect to an emitter of Q4A so as to ensure that Q4A never conducts. Coupling the base of Q4A to the emitter of Q4A, as shown, is an embodiment that ensures Q4A never conducts.

Figure 3C:
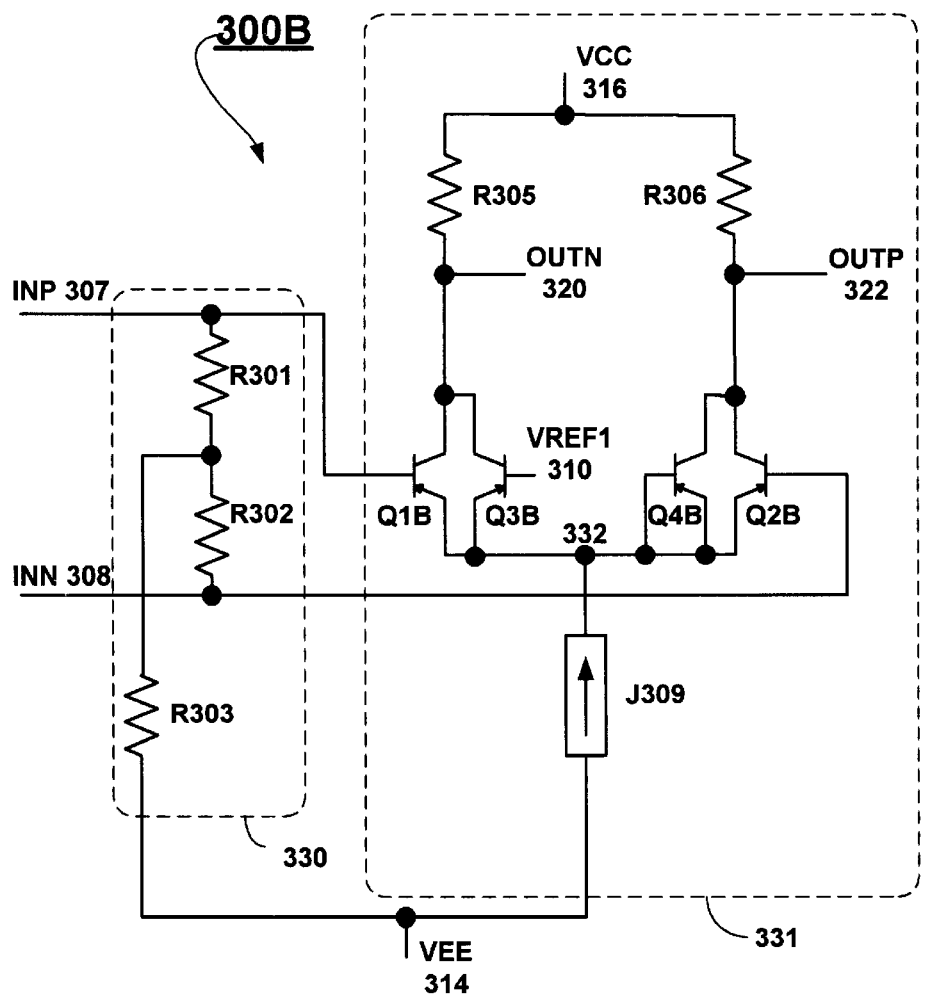
FIG. 3C shows a schematic of an enhanced differential receiver comprising PNP transistors.

Enhanced differential receiver 300B, shown in FIG. 3C, is an embodiment of enhanced differential receiver 300, embodying active devices Q1–Q4 with PNP transistors Q1B–Q4B. Remaining components with identical functions as in enhanced differential receiver 300 retain the same reference IDs. $V_{EE}$ 314 is positive with respect to $V_{CC}$ 316 in enhanced differential receiver 300B. When a differential driver actively drives INP 307 and INN 308, Q2B carries the current from current J309 if INP 307 is of higher voltage than INN 308. If INN 308 is of higher voltage than INP 307, then Q1B carries current J309. If INP 307 and INN 308 are not actively driven, pulldown terminator 330 pulls both INP 307 and INN 308 above the voltage of $V_{REF1}$, and then Q3B carries current J309; OUTN 320 will be positive with respect to OUTP 322 in this condition. Suitable well-known current source variants to the current sources shown in FIG. 4A and FIG. 4B, but utilizing PNP transistors, are advantageously used for current J309 in enhanced differential receiver 300B. In an embodiment, a simple resistor, coupled from node 332 to a suitable voltage supply, supplies current J309. In an embodiment, Q4B is omitted. In a preferred embodiment, Q4B is added to ensure symmetrical loading at OUTN 320 and OUTP 322. A base of Q4B is coupled to a disabling voltage source high enough with respect to an emitter of Q4B so as to ensure that Q4B never conducts. Coupling the base of Q4B to the emitter of Q4B, as shown, is an embodiment that ensures Q4B never conducts.

Figure 3D:
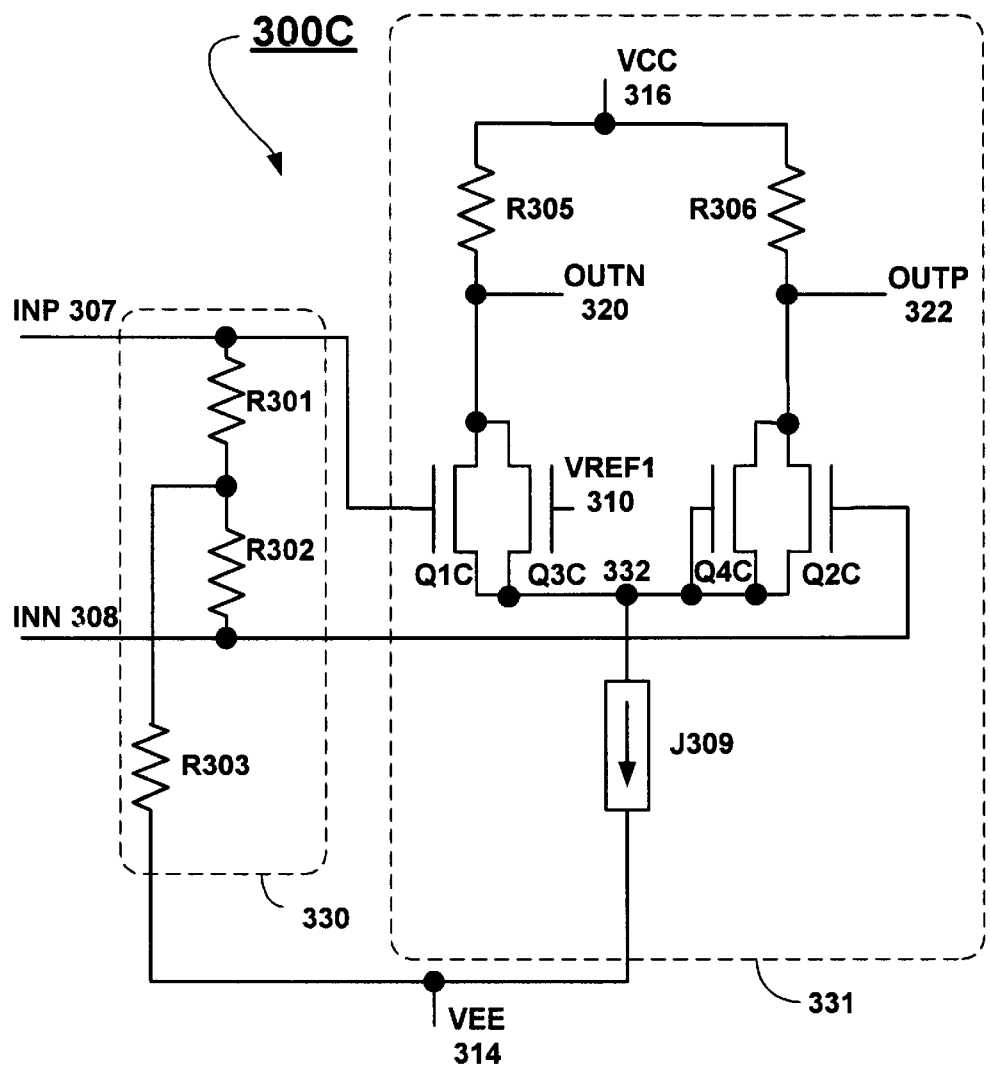
FIG. 3D shows a schematic of an enhanced differential receiver comprising NFET transistors.

Enhanced differential receiver 300C, shown in FIG. 3D, is an embodiment of enhanced differential receiver 300, embodying active devices Q1–Q4 with NFET transistors Q1C–Q4C. Remaining components with identical functions as in enhanced differential amplifier 300 retain the same reference IDs. $V_{CC}$ is positive with respect to $V_{EE}$ in enhanced differential receiver 300C. When a differential driver actively drives INP 307 and INN 308, Q1C carries the current from current J309 if INP 307 is of higher voltage than INN 308. If INN 308 is of higher voltage than INP 307, then Q2C carries current J309. If INP 307 and INN 308 are not actively driven, pulldown terminator 330 pulls both INP 307 and INN 308 towards $V_{EE}$. When INP 307 and INN 308 voltages fall below $V_{REF1}$ 310, Q3C turns on and carries substantially all current J309. OUTN 320, in this condition, will be at a "low" level and OUTP 322 will be at a "high" level. As before, no oscillation in enhanced differential receiver 300C can occur, as Q1C and Q2C are fully "off". In an embodiment, Q4C is omitted. In an embodiment, Q4C is added to ensure symmetrical loading at OUTN 320 and OUTP 322. A gate of Q4C is coupled to a disabling voltage source low enough with respect to a source of Q4C so as to ensure that Q4C never conducts. Coupling the gate of Q4C to the source of Q4C, as shown, is an embodiment that ensures Q4C never conducts. Enhanced differential receiver 300C advantageously uses a current source for current J309, such as the current source shown in FIG. 4C in an embodiment. In another embodiment a simple resistor, coupled from node 332 to a suitable voltage supply, supplies current J309.

Figure 3E:
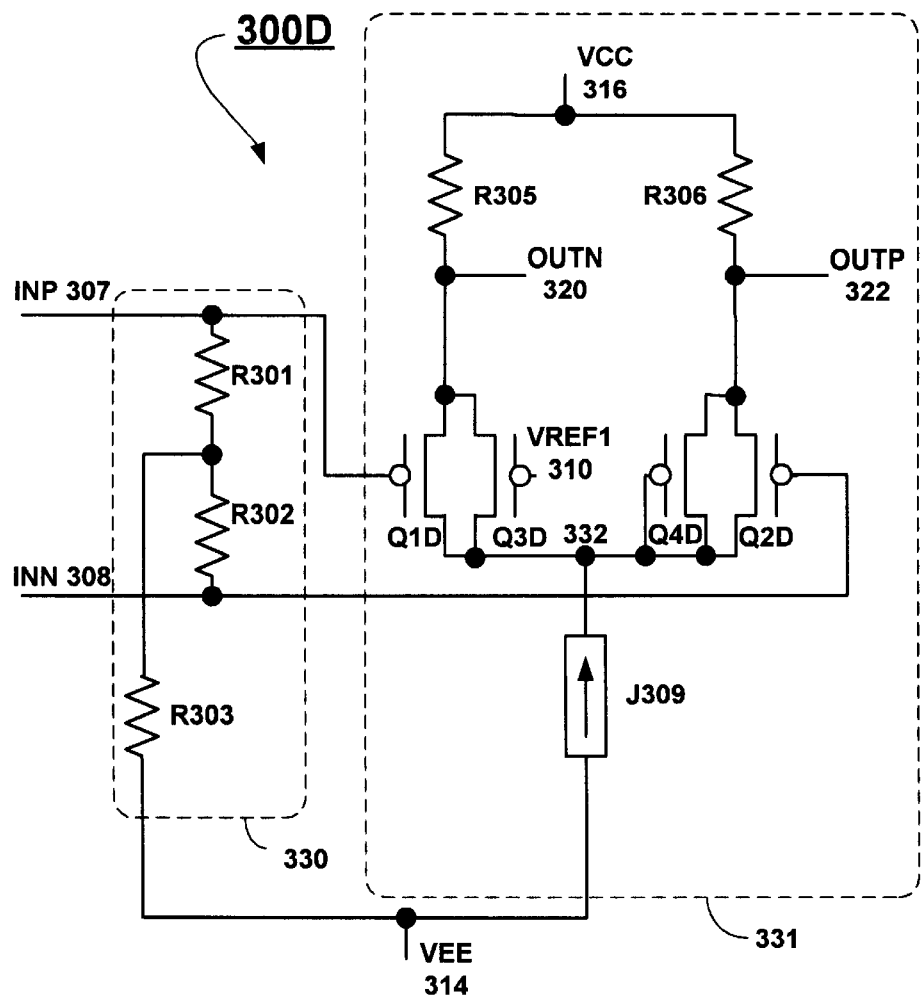
FIG. 3E shows a schematic of an enhanced differential receiver comprising PFET transistors.

Enhanced differential receiver 300D, shown in FIG. 3E, is an embodiment of enhanced differential receiver 300, embodying active devices Q1–Q4 with PFET transistors Q1D–Q4D. Remaining components with identical functions as in enhanced differential amplifier 300 retain the same reference IDs. $V_{CC}$ is negative with respect to $V_{EE}$ in enhanced differential receiver 300D. When a differential driver actively drives INP 307 and INN 308, Q2D carries current J309 if INP 307 is of higher voltage than INN 308. If INN 308 is of higher voltage than INP 307, Q1D carries current J309. If INP 307 and INN 308 are not actively driven, pulldown terminator 330 pulls both INP 307 and INN 308 towards $V_{EE}$. $V_{EE}$ is positive with respect to $V_{CC}$ in the embodiment of enhanced differential receiver 300D. When INP 307 and INN 308 voltages rise above $V_{REF1}$ 310, Q3D turns on and carries substantially all current J309. OUTN 320, in this condition, will be at a "high" level and OUTP 322 will be "low". As before, no oscillation in enhanced differential receiver 300D can occur, as Q1D and Q2D are fully off. In an embodiment, Q4D is omitted. In a preferred embodiment, Q4D is added to ensure symmetrical loading at OUTN 320 and OUTP 322. Current J309 is supplied advantageously by any well-known current source, such as a PFET variant of the current source shown in FIG. 4C. In an embodiment, current J309 is supplied by a resistor, coupled from node 332 to a suitable voltage supply.

While the present invention has been described with reference to the details of the embodiments of the invention shown in the drawings, these details are not intended to limit the scope of the invention as claimed in the appended claims.

What is claimed is:

1. An enhanced differential receiver, the enhanced differential receiver comprising:

a differential receiver input port comprising a first input and a second input;

a differential receiver output port;

a differential amplifier having a first differential input and a second differential input coupled to the first input and the second input, respectively, a reference input coupled to a reference voltage, and a differential amplifier output directly coupled to the differential receiver output port; and a pulldown terminator coupled to the first input and the second input;

wherein, when the first input and the second input are not actively driven, the pulldown terminator pulls both a voltage of the first input and a voltage of the second input past the reference voltage, at which point, respondent to the voltage of the first input and the voltage of the second input passing the reference voltage, the differential amplifier outputs a predetermined logical value.

2. The enhanced differential receiver of claim 1, wherein the pulldown terminator comprises:

a transmission line terminator; and a bias mechanism that pulls both the first input and the second input to a predetermined voltage when neither the first input nor the second input is actively driven.

3. The enhanced differential receiver of claim 2, wherein the transmission line terminator further comprises:

a first resistor having a first end coupled to the first input; and a second resistor having a first end coupled to the second input, and having a second end coupled to a second end of the first resistor.

4. The enhanced differential receiver of claim 3, wherein the first resistor and the second resistor are of substantially equal resistance.

5. The enhanced differential receiver of claim 3, wherein the bias mechanism comprises a third resistor coupled between the second end of the first resistor and a first voltage supply.

6. The enhanced differential receiver of claim 3, wherein the bias mechanism comprises a current source coupled to the second end of the first resistor.

7. The enhanced differential receiver of claim 3, wherein the bias mechanism comprises a third resistor coupled between the first end of the first resistor and a first voltage supply; and a fourth resistor coupled between the first end of the second resistor and the first voltage supply.

8. The enhanced differential receiver of claim 1, wherein the differential amplifier comprises:

a first active device having a first control port coupled to the first differential input, a first emitter/source port, and a first collector/drain port;

a second active device having second control port coupled to the second differential input, a second emitter/source port coupled to the first emitter/source port, and a second collector/drain port; and a third active device having a third control port coupled to the reference input, a third emitter/source port coupled to the first emitter/source port, and a third collector/drain port coupled to the first collector/drain port.

9. The enhanced differential receiver of claim 8, wherein the differential amplifier further comprises a load coupled to the first collector/drain port.

10. The enhanced differential receiver of claim 8, wherein the differential amplifier further comprises a load coupled to the second collector/drain port.

11. The enhanced differential receiver of claim 8, wherein the differential amplifier further comprises a fourth active device having a fourth control port coupled to a disabling voltage suitable to ensure that the fourth active device does not conduct, a fourth emitter/source port coupled to the first emitter/source port, and a fourth collector/drain port coupled to the second collector drain port.

12. The enhanced differential receiver of claim 8, wherein the first collector/drain port is coupled directly to the differential receiver output port.

13. The enhanced differential receiver of claim 8, wherein the second collector/drain port is coupled directly to the differential receiver output port.

14. The enhanced differential receiver of claim 8, the differential amplifier further comprising an amplification circuit; wherein the first collector/drain port and the second collector drain port are further coupled to a first amplification circuit input and a second amplification circuit input, respectively, and an output of the amplification circuit is directly coupled to the differential receiver output port.

15. The enhanced differential receiver of claim 8, in which the first, second, and third active devices are NPN transistors.

16. The enhanced differential receiver of claim 15, in which the fourth active device is an NPN transistor.

17. The enhanced differential receiver of claim 8, in which the first, second, and third active devices are NFET transistors.

18. The enhanced differential receiver of claim 17, in which the fourth active device is an NFET transistor.

19. The enhanced differential receiver of claim 8, in which the first, second, and third active devices are PNP transistors.

20. The enhanced differential receiver of claim 19, in which the fourth active device is a PNP transistor.

21. The enhanced differential receiver of claim 8, in which the first, second, and third active devices are PFET transistors.

22. The enhanced differential receiver of claim 21, in which the fourth active device is a PFET transistor.

* * * * *